(12) United States Patent
Hundhausen et al.

(10) Patent No.: US 7,769,111 B2
(45) Date of Patent: Aug. 3, 2010

(54) DETECTION OF LARGE CARRIER OFFSETS USING A TIMING LOOP

(75) Inventors: Amy Gayle Hundhausen, Laguna Beach, CA (US); Tommy Yu, Orange, CA (US)

(73) Assignee: Broadcom Corporation, Irvine, CA (US)

( * ) Notice: Subject to any disclaimer, the term of this patent is extended or adjusted under 35 U.S.C. 154(b) by 938 days.

(21) Appl. No.: 11/527,578

(22) Filed: Sep. 27, 2006

(65) Prior Publication Data

US 2007/0098114 A1    May 3, 2007

Related U.S. Application Data

(60) Provisional application No. 60/730,359, filed on Oct. 27, 2005.

(51) Int. Cl.
*H04L 27/14* (2006.01)

(52) U.S. Cl. .................................................... 375/326
(58) Field of Classification Search ................ 375/344, 375/326
See application file for complete search history.

(56) References Cited

U.S. PATENT DOCUMENTS

2005/0239398 A1\* 10/2005 Lai ........................... 455/3.02

\* cited by examiner

*Primary Examiner*—Kevin Y Kim
(74) *Attorney, Agent, or Firm*—Sterne, Kessler, Goldstein & Fox P.L.L.C.

(57) ABSTRACT

A method and apparatus for the detection and correction of large carrier offsets. A set of known correction carrier offsets are used to translate an input signal having a carrier offset. After applying each correction carrier offset, a state of a timing recovery loop is evaluated. The set of known correction carrier offsets are sequentially used to translate the input signal until the timing recovery loop is locked. The carrier offset is substantially acquired when the timing recovery loop is locked.

19 Claims, 6 Drawing Sheets

US 7,769,111 B2

DETECTION OF LARGE CARRIER OFFSETS USING A TIMING LOOP

CROSS-REFERENCE TO RELATED APPLICATIONS

This patent application claims the benefit of U.S. Provisional Patent Application No. 60/730,359, filed Oct. 27, 2005, entitled "Detection of Large Carrier Offsets Using a Timing Loop," which is incorporated herein by reference in its entirety.

BACKGROUND OF THE INVENTION

1. Field of the Invention

The present invention generally relates to carrier recovery. More specifically, the present invention relates to the recovery of carrier offsets using a timing recovery loop.

2. Background Art

Communication systems allow for communication over large distances by using sophisticated transponders in a satellite. Transponders may sometimes operate on an interplanetary scale. Transponders receive incoming communications over a band of frequencies, the uplink, and retransmit the communications over another band of frequencies, the downlink, at the same time. For example, transponders most frequently use the C band with an uplink from 5,925 to 6,425 MHz and a down link from 3,700 to 4,200 MHz. The uplink originates from a point on surface of the Earth, usually a ground station, to the transponder. The transponder sends the downlink to a point or region on the surface of the Earth, usually to one or more ground stations or receivers.

Communications in a digital communication system requires convergence of several signal processing algorithms before the receiver, usually located in the downlink, can output meaningful data. One such signal processing algorithm uses a timing recovery process to obtain symbol synchronization. Symbol synchronization involves determining the sample frequency and sample phase of the received symbol. The determination of the sample frequency requires an estimate of the symbol period to sample at the correct rate. The sample phase involves determining the correct time within a symbol period to take a sample.

After obtaining symbol synchronization, another signal processing algorithm uses a carrier recovery process to remove unknown frequency offsets from the received communication signal. Ideally, the frequency of an oscillator in the digital receiver system will match the frequency of an oscillator used at the transmitter. In practice, their frequencies differ. For example, the motion of the satellite or any variation in the oscillator of the receiver can cause the frequency difference between the transmitter and receiver oscillators. When the frequency of the transmitter oscillator differs from the frequency of the receiver oscillator, the process of down-conversion results in an unknown offset in the frequency content of the received communication signal relative to the transmitted communication signal. The receiver may use a carrier recovery loop to remove these unknown frequency offsets from the symbol content of the received communication signal.

Unfortunately, the timing recovery process and the carrier recovery process are not always independent. In fact, a large carrier offset may prohibit the timing recovery process from obtaining symbol synchronization. As a result, the data of the receiver may be corrupt. To correct for large carrier offsets, some conventional digital receiver systems achieve a coarse carrier offset acquisition by blindly stepping through carrier offsets and determining the convergence of the complete receiver. The complete receiver may consist of a timing recovery loop for the timing recovery process, a carrier recovery loop for the carrier recovery process, and additional forward error code (FEC) modules. Blindly stepping through carrier offsets and determining the convergence of the complete receiver may require a significant amount of time. Other conventional techniques for detecting and correcting for large carrier offsets require the use of non-decision directed digital PLLs for carrier recovery that perform poorly at low signal to noise ratios, and require the use of known data symbols. Further, some conventional digital receiver systems perform high level "tests" on a set of carrier frequency offsets that are complex and use the complete receiver and forward error code (FEC) acquisition as the "pass/fail" metric.

Therefore, what is needed is a digital receiver system to quickly and efficiently correct for large carrier offsets.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

Figure 1:
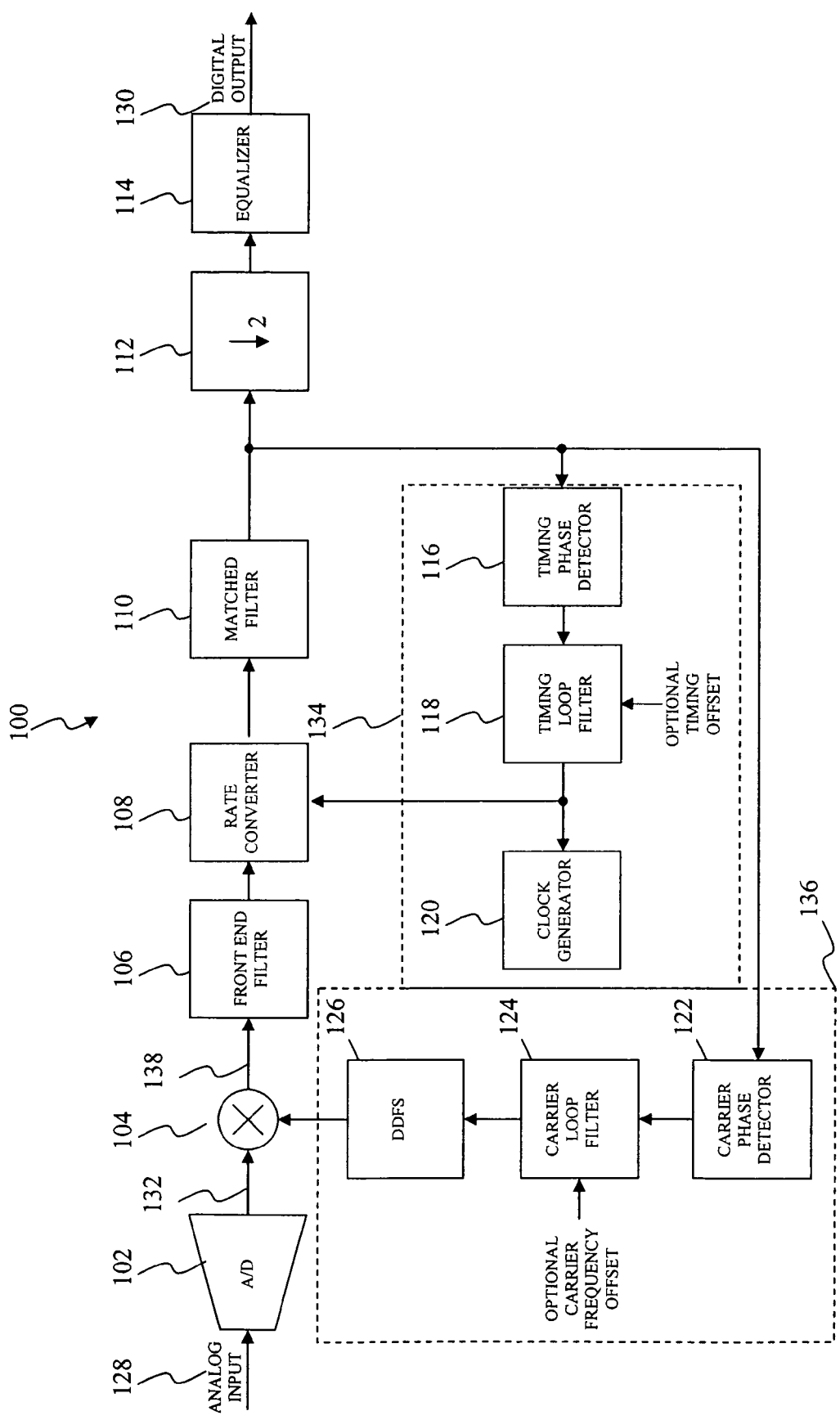
FIG. 1 is an illustration of a block diagram of a digital receiver system according to an embodiment of the present invention.

FIG. 1 is an illustration of a block diagram of a digital receiver system according to an embodiment of the present invention. Digital receiver system 100 uses a timing recovery loop that cannot operate in the presence of a large carrier offset. Accordingly, the present invention is generally applicable to any digital receiver system that uses a digital PLL for timing recovery whose performance degrades in the presence of a large carrier offset. For example, the present invention is applicable to the commonly used Gardner timing loop.

Digital receiver system 100 includes an analog input 128 and a digital output 130. In an exemplary embodiment, digital receiver system 100 is a portion of a satellite receiver, for example, within a set-top box or satellite modem. Digital receiver system 100 receives analog input 128, which is a down-converted version of a received satellite communication signal. Ideally, the frequency of an oscillator in the digital receiver system will match the frequency of an oscillator used at the transmitter. In practice, their frequencies differ. For example, the motion of the satellite or any variation in the oscillator of the receiver can cause the frequency difference between the transmitter and receiver oscillators. When the frequency of the transmitter oscillator differs from the frequency of the receiver oscillator, the process of down-conversion results in an unknown offset in the frequency content of analog signal 128 relative to the transmitted communications signal.

Digital receiver system 100 coarsely steers the frequency used to correct for the unknown carrier offset. A main data path of the digital receiver system 100 includes an analog-to-digital converter (A/D) 102, a mixer 104, a front-end filter 106, a rate converter 108, a matched filter 110, a down sampler 112 and an equalizer 114. A/D converter 102 converts analog input 128 to digital signal 132. Mixer 104 uses a signal generated by direct to digital frequency synthesizer DDFS 126 to correct for the unknown carrier offset to produce digital signal 138. A carrier recovery loop, discussed in further detail below, determines the signal generated by DDFS 126 to correct for the unknown carrier offset. Front end filter 106 may filter out of band noise to prevent aliasing as well as to reject images produced during the resampling of digital signal 138. Implementations for front end filter 106 may include a finite impulse response (FIR) filter, an infinite impulse response (IIR) filter, or a recursive filter to provide some examples. Rate converter 108 resamples digital signal 138. During the resampling process, rate converter 108 attempts to sample the midpoint of each symbol comprising digital signal 138. A timing recovery loop, discussed in further detail below, determines the proper sampling time for rate converter 108. Matched filter 110 filters the resampled version of digital signal 138 with a filter whose shape matches the pulse shape of the transmitted communication signal. In addition to limiting the amount of noise spectrum passed onto subsequent stages, matched filter 110 provides digital receiver system 100 with a stronger signal to work with by correlating the resampled version of digital signal 138 with the pulse shape of the transmitted communication signal over the symbol period. After matched filter 110, digital signal 138 is further down-sampled by down sampler 112. Down sampler 112 increases the sampling interval of digital signal 138 by down-sampling digital signal 138 to reduce the sampling rate. In an exemplary embodiment, down sampler 112 increases the sampling interval of digital signal 138 by a factor of two by reducing the sampling rate by a factor of two. After down-sampling digital signal 138, equalizer 114 equalizes digital signal 138. Equalizer 114 may compensate for distortion in analog input 128 resultant from the communication channel.

A timing recovery loop, denoted as 134, determines the proper sampling time for rate converter 108. The timing recovery loop of the digital receiver system 100 includes a timing phase detector 116, a timing loop filter 118, a clock generator 120, and several components of the primary data path. In an exemplary embodiment of digital receiver system 100, the timing recovery loop also includes rate converter 108 and matched filter 110. A timing offset is the difference between the frequency and phase employed by the receiver for symbol timing and the frequency and phase employed by the transmitter for symbol timing. A true timing offset refers to the frequency and phase employed by the receiver for symbol timing prior to the enabling of the timing recovery process. Timing phase detector 116 generates a signal proportional to the difference between a current estimate of the timing offset and a true timing offset. The output of timing phase detector 116 is approximately zero volts when the current estimate of the timing offset is substantially equal to the true timing offset. Timing loop filter 118 both integrates the signal produced by and suppresses noise embedded within the timing recovery loop. Clock generator 120 generates a master clock used by rate converter 108 to sample digital signal 138. The signal generated by timing loop filter 118 determines the frequency and phase of this master clock.

In the exemplary embodiment of FIG. 1, if the signal generated by timing phase detector 116 is approximately zero volts, then the current estimate of the timing offset equals the true timing offset. In this case, the timing recovery loop is considered as having converged. When the timing recovery loop converges, the symbols will be properly sampled (i.e., sampled at approximately their midpoints). More specifically, rate converter 108 has obtained symbol synchronization by resampling digital signal 138 at the peak.

On the other hand, if the signal generated by timing phase detector 116 is not approximately zero volts, then the current estimate of the timing offset differs from the true timing offset. In this case, the timing recovery loop has not converged. When the timing recovery loop does not converge, the symbols are not sampled properly (i.e., the symbols are sampled at positions other than their respective midpoints). More specifically, rate converter 108 has not obtained symbol synchronization, and the current estimate of the timing offset requires correction. The signal generated by the timing phase detector 116 determines the amount of correction. Timing phase detector 116, clock generator 120, and rate converter 108 will continue to operate in a similar manner until the timing loop converges provided digital signal 138 contains no large carrier offsets.

After convergence of the timing loop, a carrier recovery loop, denoted as 136, determines the signal used by the DDFS 126 to correct for the carrier offset. The carrier recovery loop of digital receiver system 100 can include a carrier phase detector 122, a carrier loop filter 124, a DDFS 126, and several components of the primary data path. In another exemplary embodiment, the carrier recovery loop also includes mixer 104, front-end filter 106, rate converter 108, and matched filter 110.

Carrier phase detector 122 generates a signal proportional to the difference between the current estimate of the carrier offset and the true carrier offset. Carrier loop filter 124 both integrates the signal produced by and suppresses noise embedded within the carrier recovery loop. DDFS 126 generates a signal to correct for the carrier offset. The signal generated by carrier loop filter 124 determines the frequency and phase of the signal generated by DDFS 126. When the signal generated by carrier phase detector 122 is approximately zero volts, the current estimate for the carrier offset equals the unknown carrier offset. The carrier recovery loop is considered as having converged.

When the carrier recovery loop converges, the carrier recovery loop corrects for the unknown carrier offset. More specifically, when the carrier recovery loop converges, digital receiver system 100 adjusts the frequency of DDFS 126 to compensate for the unknown carrier offset. The frequency of DDFS 126 may also be adjusted to allow for known frequency translations such as up and down conversion. In an exemplary embodiment, digital receiver system 100 adjusts the frequency of DDFS 126 to allow mixer 104 to down-convert digital signal 132 to baseband as well as to compensate for unknown carrier offsets in digital signal 132. On the other hand, if the signal generated by carrier phase detector 122 is a fluctuating value in the digital domain, the current estimate of the carrier offset differs from the unknown carrier offset, and the carrier recovery loop has not converged. When the carrier recovery loop does not converge, the carrier recovery loop does not correct for the unknown carrier offset. More specifically, digital receiver system 100 has not properly adjusted the frequency of DDFS 126 to compensate for the unknown carrier offset, and the current estimate of the carrier offset requires correction. The signal generated by carrier phase detector 122 determines the amount of correction. Carrier phase detector 122, DDFS 126, and mixer 104 continue to operate in a similar manner until the carrier loop converges.

A large carrier offset may prohibit the timing recovery loop from obtaining symbol synchronization, while the timing recovery loop can obtain symbol synchronization for a small carrier offset. Monitoring the convergence of the timing recovery loop allows digital receiver system 100 to determine whether an unknown carrier offset in digital signal 138 is a small carrier offset or a large carrier offset. For a small carrier offset, the timing recovery loop will respond to a timing error and converge to the true timing offset, but for a large carrier offset, the timing recovery loop may not respond to a timing error and therefore will not converge. The exemplary embodiment of FIG. 1 uses clock generator 120 to monitor the convergence of the timing recovery loop. Alternatively, some other mechanism can be used to monitor the convergence of the timing recovery loop.

Timing loop filter 118 produces a control word that generates frequency and phase of the master clock. The determination of convergence of the timing recovery loop begins by monitoring the control word before injection of a small timing error. The timing error has a small duration to allow the timing recovery loop to converge. After injecting the timing error into the timing recovery loop and waiting a predetermined amount of time, digital receiver system 100 monitors the control word once again. If the control word is substantially the same before and after the injection of the timing error into the timing recovery loop, the timing recovery loop has converged. In another exemplary embodiment, digital receiver system 100 compares the difference between the control word before and after the injection of the timing error to a threshold to determine whether the timing recovery loop has converged.

Figure 2A:
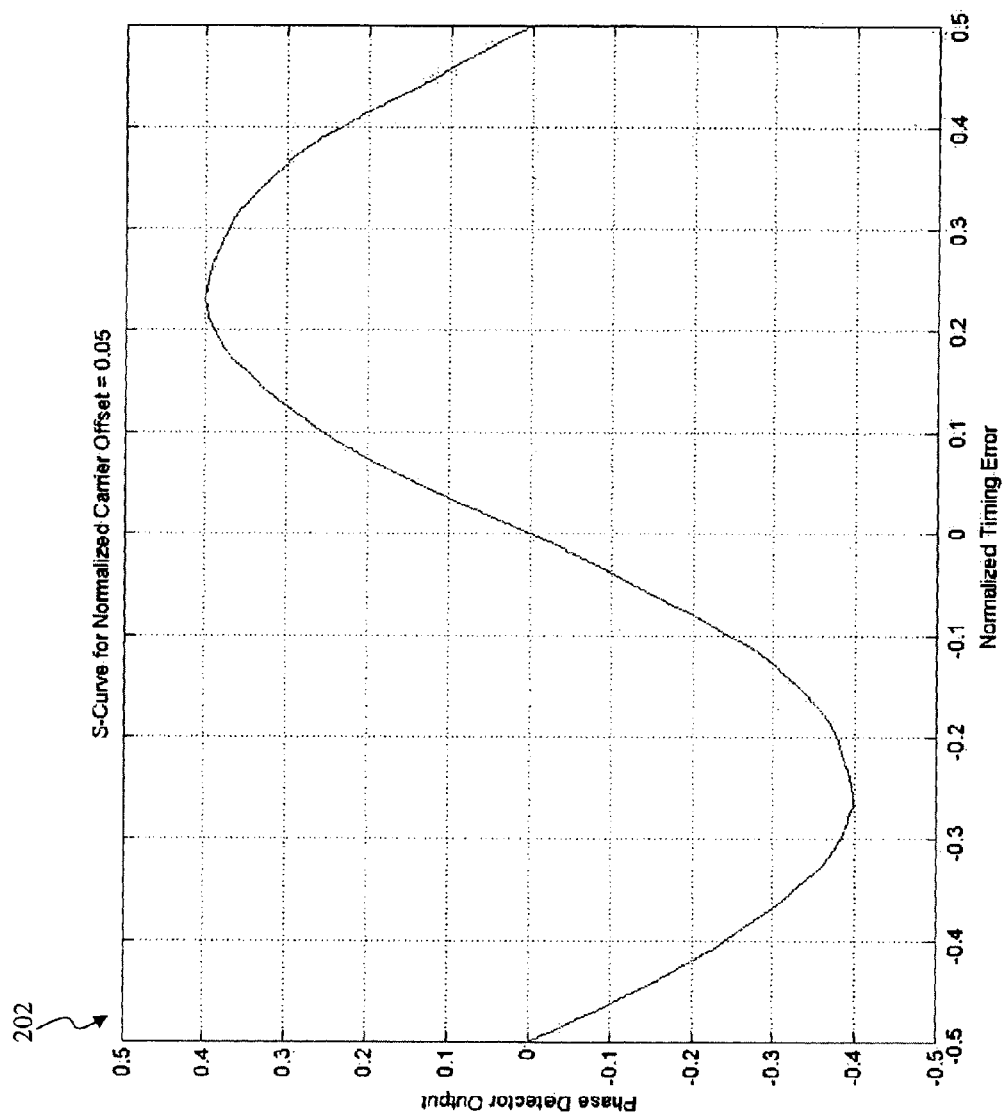
FIG. 2A is a graphical illustration of an S curve for a timing phase detector with a carrier offset that is 5% of the baud rate according to an embodiment of the present invention.
Figure 2B:
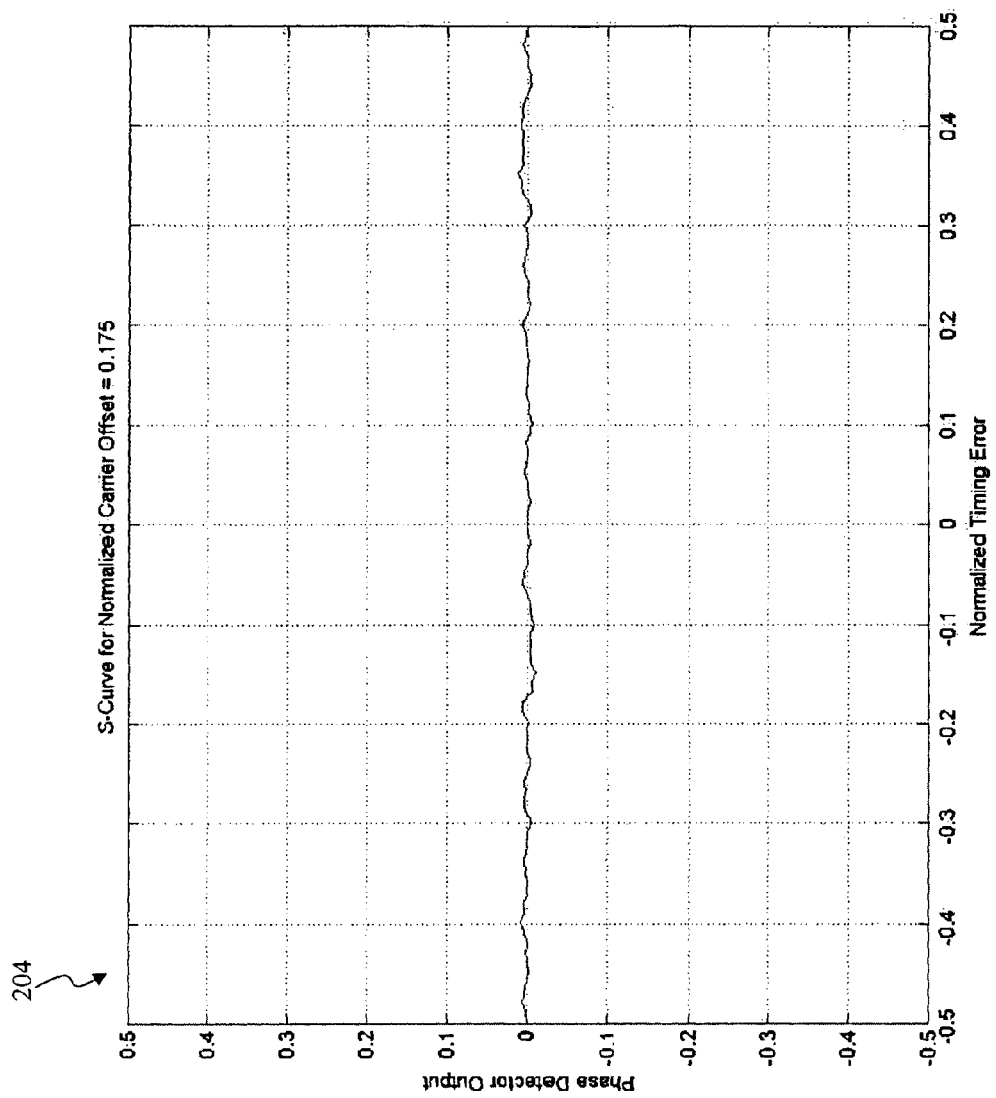
FIG. 2B is a graphical illustration of an S curve for a timing phase detector with a carrier offset that is 17.5% of the baud rate according to an embodiment of the present invention.

FIG. 2A and FIG. 2B demonstrate the effect of carrier offsets on the performance of the timing recovery loop. FIG. 2A shows a graphical illustration of an S curve 202 for a timing phase detector with a carrier offset that is 5% of the baud rate according to an embodiment of the present invention. In the exemplary embodiment of FIG. 1, for a baud rate of 20 Msps (mega symbols per second), down-converted digital signal 138 has a carrier offset of 1.0 MHz. As shown in FIG. 2A, introduction of the timing error in the timing recovery loop causes phase detector 116 to respond when digital signal 138 has an offset of 1.0 MHz. In an exemplary embodiment, digital receiver system 100 introduces a one sample timing error directly into the timing recovery loop. In another exemplary embodiment, digital receiver system 100 introduces the timing error, denoted as optional timing offset in FIG. 1, into an integrator that forms a portion of timing loop filter 118. Phase detector 116 responds by generating a signal to correct for the timing error. For example, introduction of a normalized timing error of 0.1, which equates to a timing error of 5.0 nS for a baud rate of 20 Msps, in the timing recovery loop causes phase detector 116 to respond by outputting a value of approximately 0.25 as shown in FIG. 2A. In this scenario, the timing recovery loop will converge to the true timing offset for a carrier offset of 1.0 MHz. The values for other responses of phase detector 116 for other timing errors can be determined FIG. 2A in a similar manner. As demonstrated in FIG. 2A, phase detector 116 responds to timing phase errors and by extension timing frequency errors.

As shown in FIG. 2B, for a large carrier offset of 3.5 MHz, however, the timing recovery loop will not respond to a timing error and will not converge to the true timing offset. A large carrier offset may prohibit the timing recovery loop from obtaining symbol synchronization. FIG. 2B shows a graphical illustration of an S curve 204 for a timing phase detector with a carrier offset that is 17.5% of the baud rate according to an embodiment of the present invention. For a baud rate of 20 Msps, digital signal 132 has a carrier offset of 3.5 MHz. As shown in FIG. 2B, phase detector 116 does not respond to the introduction of a normalized timing error of 0.1, which equates to a timing error of 5.0 nS for a baud rate of 20 Msps, into the timing recovery loop. In this scenario, the timing recovery loop will not converge to the true timing offset for a carrier offset of 3.5 MHz.

The present invention provides coarse carrier recovery by using known correction carrier offsets to correct for large carrier offsets The correction carrier offsets include predetermined values that depend on the excessive bandwidth of matched filter 110. The characteristics of matched filter 110 are determined in accordance with the Nyquist theory that is well known to those skilled in the art. The excessive bandwidth of matched filter 110 determines the maximum size of the carrier offset that allows the timing recovery loop to converge. For example, the timing recovery loop of a digital receiver system including a matched filter with an excessive bandwidth of 2 MHz may be able to converge with a carrier offset up to 2 MHz. Applying the correction carrier offset to the carrier recovery loop allows the timing recovery loop to converge.

In the present invention, digital receiver system 100 introduces a correction carrier offset, denoted as optional carrier frequency offset in FIG. 1, into carrier loop filter 124. From the above example, the convergence of the timing recovery loop with a carrier offset of 5 MHz requires a correction carrier offset to translate the frequency content of digital signal 132 so that digital signal 138 resides within the bandwidth of matched filter 110. Introducing the correction carrier. offset of −3 MHz into carrier loop filter 124 translates the frequency content of digital signal 132 by −3 MHz. A residual carrier offset is the carrier offset present in digital signal 138. From the above example, by translating the frequency content of digital signal 132, digital receiver system 100 substantially reduces the residual carrier offset of 5 MHz to 2 MHz allowing for convergence of the timing recovery loop.

To correct for unknown carrier offsets, a set of predetermined known correction carrier offsets may be used. The correction carrier offsets may be evenly spaced apart based upon both the maximum allowable size of the carrier offset and the Nyquist filter excessive bandwidth. For example, for a timing recovery loop able to converge with carrier offsets up to 2 MHz, the convergence of the timing recovery loop with a carrier offset between −5 MHz to 5 MHz requires correction carrier offsets of −3 MHz, 0 MHz, and +3 MHz. The correction carrier offset may comprise a set of offsets, one correction carrier offset corresponding to a carrier offset of 3 MHz, another correction carrier offset corresponding to no carrier offset, and a final correction carrier offset corresponding to a carrier offset of −3 MHz.

The set of known correction carrier offsets can be sequentially used to translate the frequency content of digital signal 132 until selection of a correction offset that allows the timing recovery loop to converge. Digital receiver system 100 initializes to a correction carrier offset corresponding to no carrier offset before sequencing through other correction carrier offsets. If the injection of the correction carrier offset causes the timing loop to converge, digital receiver system 100 has acquired symbol synchronization. Digital receiver system 100 corrects for the remainder of the unknown carrier offset using the carrier recovery loop. If the injection of the correction carrier offset does not cause the timing loop to converge, the process repeats using another correction carrier offset until the timing loop converges.

To correct for large carrier offsets, some conventional digital receiver systems achieve a coarse carrier offset acquisition by blindly stepping through correction carrier offsets and determining the convergence of the complete receiver. The complete receiver may consist of a timing recovery loop for the timing recovery process, a carrier recovery loop for the carrier recovery process, and additional forward error code (FEC) modules. Blindly stepping through correction carrier offsets and determining the convergence of the complete receiver may require a significant amount of time. For example, for a timing recovery loop able to converge with carrier offsets up to 2 MHz, to acquire symbol synchronization for carrier offsets between −5 MHz and 5 MHz, conventional digital receiver systems step through all possible carrier offsets and test for convergence of the complete receiver. These correction carrier offsets may include −5 MHz, −4 MHz, −3 MHz, −2 MHz, −1 MHz, 0 MHz, 1 MHz, 2 MHz, 3 MHz, 4 MHz, and 5 MHz. The conventional receiver will step through these offsets and test for convergence of the complete receiver for each carrier offset. Stepping through all possible carrier offsets by the conventional digital receiver system may result in an acquisition time upwards of one second. The coarse carrier acquisition scheme provided by an aspect of the present invention, however, allows for a more rapid acquisition of coarse carrier offsets. For the above example, use of the coarse carrier acquisition scheme of the present invention allows for stepping through only three carrier offsets, −3 MHz, 0 MHz, and 3 MHz and testing for convergence of the timing recovery loop only. The coarse carrier acquisition scheme of the present invention can reduce the carrier acquisition time from approximately one second to approximately one hundred milliseconds.

Figure 3:
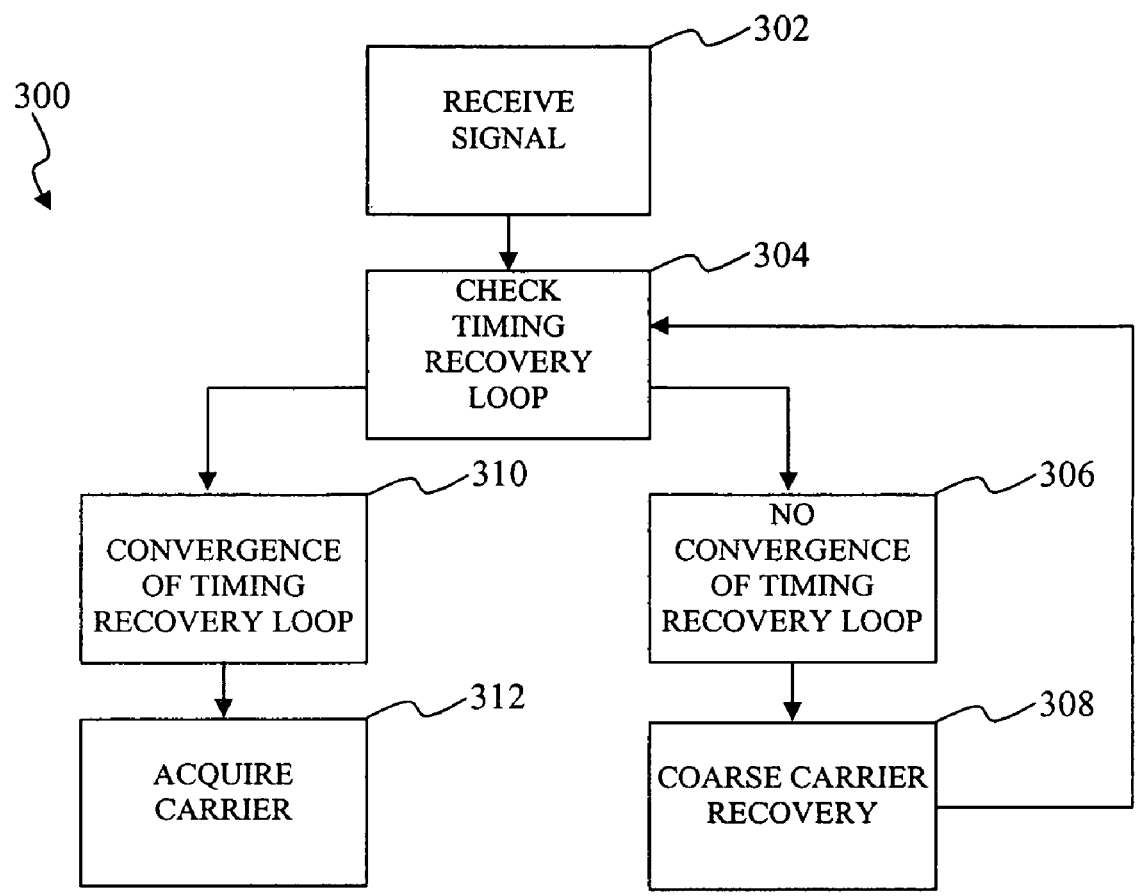
FIG. 3 is a flowchart of exemplary operational steps for the detection and correction of a carrier offset using a timing recovery loop of a digital receiver system according to a first aspect of the present invention.

FIG. 3 is a flowchart 300 of exemplary operational steps for the detection and correction of a carrier offset using a timing recovery loop of a digital receiver system according to a first aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 3.

At step 302, a digital receiver system receives a communication signal. The frequency content of the received communication signal is offset from the frequency content of the transmitted communication signal by an unknown amount. For example, the motion of the satellite or any variation in the output of a crystal oscillator used for down-conversion can cause the unknown frequency offset between the transmitted communication signal and a received communication signal At step 304, digital receiver system checks the convergence of the timing recovery loop. If the timing recovery loop converges, the digital receiver system proceeds to step 310, otherwise digital receiver system proceeds to step 306.

At step 310, the timing recovery loop of the digital receiver system has converged. The offset of the received communication signal is a small carrier offset. The digital receiver system has acquired the timing for symbol synchronization. The digital receiver system has used the timing recovery loop to determine the sample frequency and sample phase of the received symbol.

At step 312, the digital receiver system acquires the carrier after acquiring the timing. The digital receiver system uses a carrier recovery loop to remove residual frequency offsets and therefore allow it to process the symbols of the received communication signal at the frequency of the transmitted communication signal.

At step 306, the timing recovery loop of the digital receiver system has not converged. The received communication signal contains a large carrier offset. The digital receiver system proceeds to step 308.

At step 308, the digital receiver system performs a coarse carrier recovery by introducing a correction carrier offset into the carrier recovery loop. Introduction of the correction carrier offset further translates the received communication signal closer in frequency to the transmitted communication signal to allow for the convergence of the timing recovery loop. After step 308, the digital receiver system reverts back to step 304 to check the convergence of the timing loop.

Figure 4:
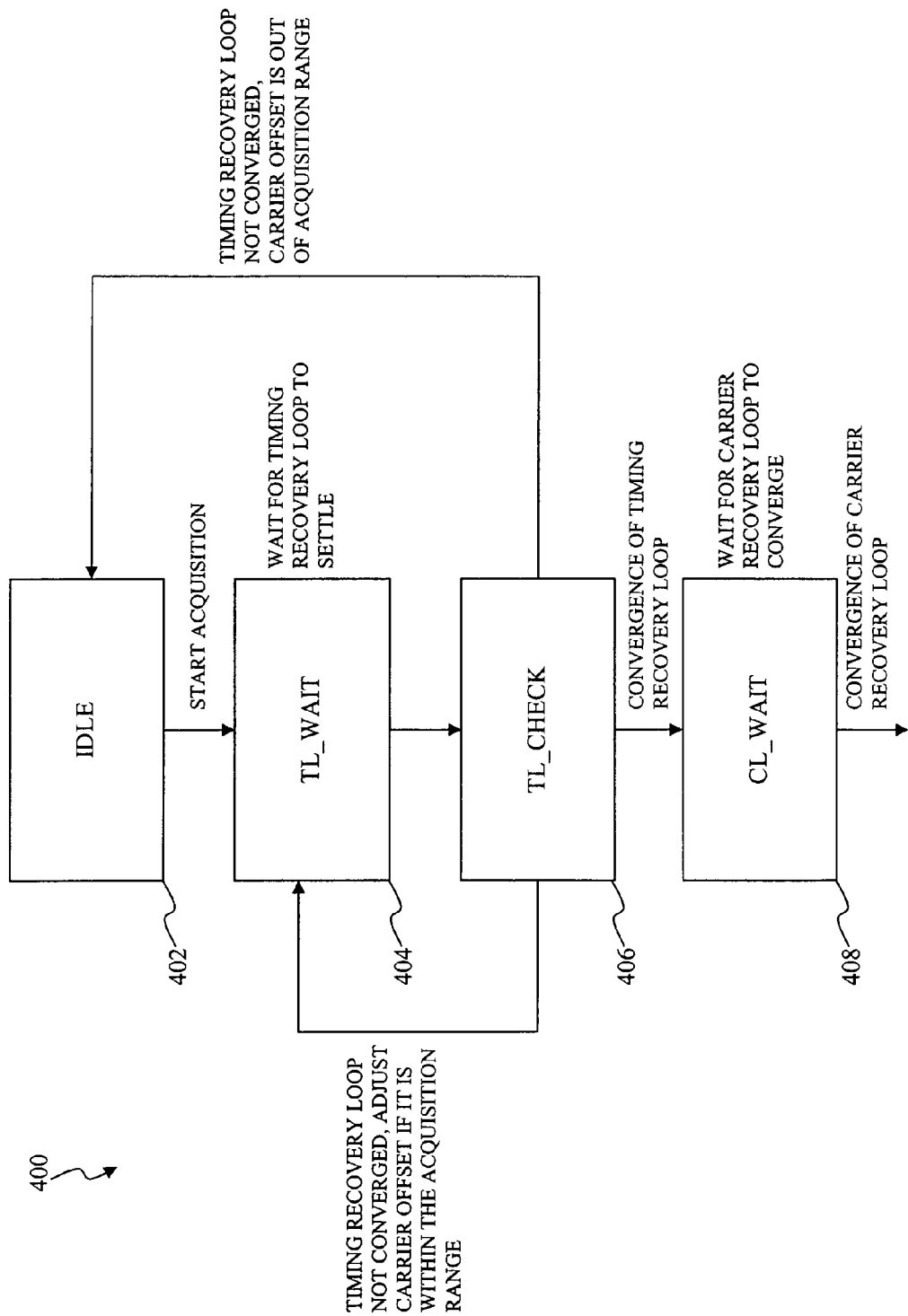
FIG. 4 is a flowchart of exemplary operational steps for the detection and correction of a carrier offset using a timing recovery loop of a digital receiver system according to a second aspect of the present invention.

FIG. 4 is a flowchart 400 of exemplary operational steps for the detection and correction of a carrier offset using a timing recovery loop of a digital receiver system according to a second aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 4.

At step 402, the detection and correction mechanism of the present invention is in an idle state. To depart from the idle state 402, the detection and correction mechanism of the present invention proceeds to coarse steer the digital signal 132 in order to acquire convergence of the timing loop. The detection and correction mechanism selects and applies a correction carrier offset to the carrier recovery loop. The correction carrier offsets are a predetermined set of correction carrier offset steps that depend on the Nyquist filter excessive bandwidth. The excessive bandwidth determines the maximum size of the correction carrier offset that allows the timing recovery loop to converge.

At step 404, the detection and correction mechanism of the present invention waits for the timing loop to settle. More specifically, after applying the initial correction carrier offset, a finite amount of time passes before the timing recovery loop adjusts to the correction carrier offset.

Step 406 involves monitoring the timing recovery loop to determine whether the timing recovery loop is capable of converging. If the timing recovery loop is capable of converging, the detection and correction mechanism of the present invention proceeds to step 408.

If the timing recovery loop is not capable of converging and the next correction carrier offset selected is within the selected acquisition range, the detection and correction mechanism of the present invention selects and applies the next correction carrier offset then returns to step 404. If the timing recovery loop has not converged and the next correction carrier offset selected is not within the selected acquisition range, then detection and correction mechanism of the present invention restarts. Specifically, the detection and correction mechanism of the present invention returns to step 402 and steps through the selected acquisition range again or uses another acquisition range.

Step 408 is a wait step that allows the carrier recovery loop to converge. The carrier recovery loop may compensate for remainder of the carrier offset. At the end of step 408, the carrier is converged or substantially converged.

Figure 5:
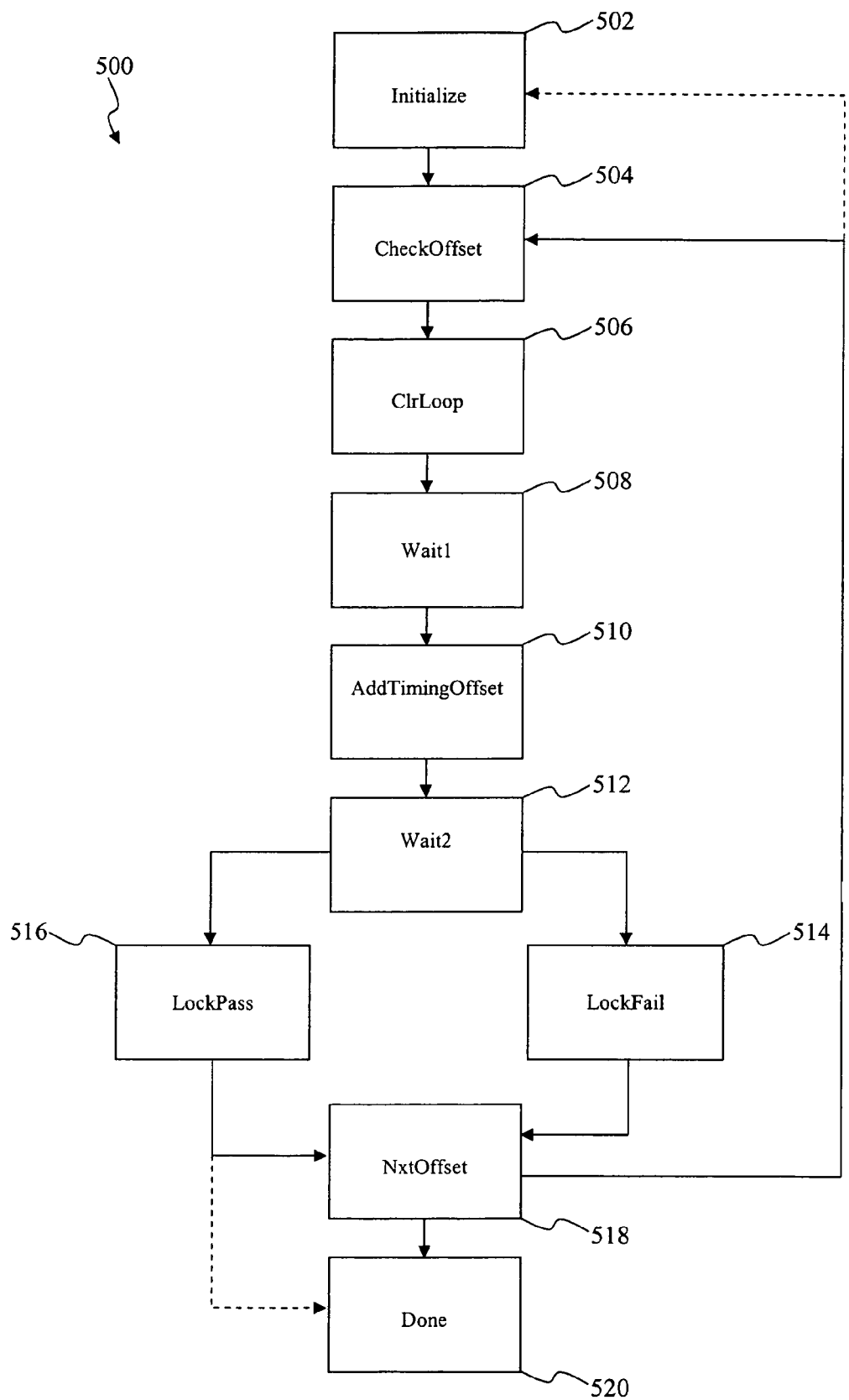
FIG. 5 is a flowchart of exemplary operational steps for the detection and correction of a carrier offset using a timing recovery loop of a digital receiver system according to a third aspect of the present invention.

FIG. 5 is a flowchart 500 of exemplary operational steps for the detection and correction of a carrier offset using a timing recovery loop of a digital receiver system according to a third aspect of the present invention. Flowchart 500 illustrates the additional use of a known timing frequency offset in a timing loop integrator. FIG. 1 depicts the use of the optional timing frequency offset. The invention is not limited to this operational description. Rather, it will be apparent to persons skilled in the relevant art(s) from the teachings herein that other operational control flows are within the scope and spirit of the present invention. The following discussion describes the steps in FIG. 5.

An Initialize state 502 is a reset state for the digital receiver system. The digital receiver system gathers a set of predetermined correction carrier offsets to test for convergence of the timing recovery loop. In addition, the reset state may include resetting the carrier recovery loop of the digital receiver system, resetting the timing recovery loop integrator of the digital receiver system, and setting a correction carrier offset to 0 MHz to provide some examples. In an exemplary embodiment, timing loop filter 118, depicted in FIG. 1, may include a timing recovery loop integrator. In another exemplary embodiment, the carrier loop filter 124, depicted in FIG. 1, may include a carrier recovery loop integrator.

A CheckOffset state 504 adds a correction carrier offset to the carrier recovery loop filter integrator. Alternatively, some other mechanism can be used to introduce the correction carrier offset. For example, in FIG. 1, the known offset can be applied to the mixer 104 via the DDFS 126, a carrier offset generator or through some other mechanism. An exemplary embodiment uses known correction carrier offsets for coarse carrier recovery, which is a process that corrects for large carrier offsets The correction carrier offsets may include predetermined values that depend on a Nyquist filter excessive bandwidth.

As discussed above, the Nyquist theory determines the characteristics of matched filter 110, depicted in FIG. 1. The excessive bandwidth of the Nyquist filter may determine the maximum size of the carrier offset that allows the timing recovery loop to converge. The digital receiver system selects a predetermined or pre-selected set of carrier offsets steps that are sequentially tested. The correction carrier offsets may be evenly spaced apart based upon maximum size of the carrier offset. The first time that the CheckOffset state 504 is entered, the carrier frequency offset may be arbitrarily chosen to be 0 MHz.

A ClrLoop state 506 resets the timing recovery loop filter integrator.

A Wait1 state 508 is a wait state accounting for timing loop convergence. Upon completion of the Wait1 state 508, the value of the timing loop filter is stored.

An AddTimingOffset state 510 adds a known timing error to the timing recovery loop. More specifically, the known timing error is a small error in timing which a timing recovery loop will respond to and correct if it is able to converge. In an exemplary embodiment, the timing error is introduced into the timing recovery loop. In this embodiment, the timing error lasts for a single sample period. In another exemplary embodiment, the timing error is introduced into an integrator located within a timing loop filter. In this embodiment, the integrator converts the timing error to a timing frequency error allowing the timing error to persist for more than a single sample period.

A Wait2 state 512 is another wait state accounting for timing recovery loop convergence.

After injecting the timing error into the timing recovery loop and waiting a predetermined amount of time, the digital receiver system compares the current value of the timing loop filter integrator to the stored value of the timing loop filter integrator to determine convergence of the timing recovery loop. If the difference between the current value of the timing loop filter integrator and the stored value of the timing loop filter integrator is less than a threshold value, digital receiver system enters into LockPass state 516. If the difference between the current value of the timing loop filter integrator and the stored value of the timing loop filter integrator is more than a threshold value, digital receiver system enters into LockFail state 514.

LockPass state 516 and LockFail state 514 reflect whether the timing recovery loop integrator value is sufficiently close to the value that was stored at the end of the Wait1 state 508 to indicate convergence of the timing recovery loop. In LockPass state 516, the timing recovery loop integrator value is sufficiently close to the value that was stored at the end of the Wait1 state 508. The timing recovery loop has converged with the known correction carrier offset used in CheckOffset state 504. The digital receiver system proceeds to NxtOffset state 518 or Done state 520. On the other hand, in LockFail state 514, the timing recovery loop integrator value is not sufficiently close to the value that was stored at the end of the Wait1 state 508. The timing recovery loop has not converged with the known correction carrier offset used in CheckOffset state 504. The digital receiver system proceeds to NxtOffset state 518.

A NxtOffset state 518 selects the next correction carrier offset that will be tested. NxtOffset state 518 allows the digital receiver system to evaluate each correction carrier offset among the set of correction carrier offsets to determine which offset results in the most robust timing recovery loop. In an exemplary embodiment, NxtOffset state 518 is an optional state when the preceding state was LockPass state 516. In this embodiment, the digital receiver system ceases evaluating other correction carrier offsets upon discovery of a correction carrier offset that causes the timing recovery loop to converge. In this situation, the digital receiver system bypasses NxtOffset state 518. In other words, once digital receiver system discovers a correction carrier offset that causes the timing recovery loop to converge, digital receiver system does not evaluate the convergence of the remaining correction carrier offsets.

After selection of the next correction carrier offset, the digital receiver system evaluates the convergence of the timing recovery loop using the next correction carrier offset by returning to CheckOffset state 504. Digital receiver system enters CheckOffset state 504 to evaluate other correction carrier offsets. Otherwise, digital receiver system proceeds to Initialize state 502 after evaluating all the available correction carrier offsets without entering into LockPass state 516. In other words, digital receiver system reenters Initialization state 502 after checking all of the correction carrier offsets with none allowing the timing recovery loop to converge. By proceeding to Initialize state 502, the digital receiver system may gather a new set of correction carrier offsets.

After testing of all the correction carrier offsets, if at least one has been shown to result in a robust timing recovery loop, the digital receiver system enters Done state 520.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A digital receiver system for providing coarse carrier offset acquisition, comprising:
   a mixer configured to receive an input signal having a carrier offset;
   a carrier recovery loop coupled to an input of said mixer; and
   a timing recovery loop coupled to an output of said mixer,
   wherein said carrier recovery loop is configured to introduce one of a set of correction carrier offsets to said mixer until said timing recovery loop converges, and
   wherein known timing errors are introduced into said timing recovery loop to determine said convergence of said timing recovery loop.

2. The digital receiver system of claim 1, wherein said input signal has a symbol rate of 20 Msps (mega symbols per second) and said carrier offset has a maximum offset of 5 MHz.

3. A digital receiver system for providing coarse carrier offset acquisition, comprising:
   a mixer configured to receive an input signal having a carrier offset;
   a carrier recovery loop, coupled to an input of said mixer, including:
      a carrier phase detector, coupled to said output of said mixer, configured to generate an output related to a difference between an estimate of said carrier offset and a true value of said carrier offset, and
      a direct to digital frequency synthesizer (DDFS), coupled to said carrier phase detector, configured to generate a signal based upon said output of said carrier phase detector; and
   a timing recovery loop coupled to an output of said mixer, wherein said carrier recovery loop is configured to introduce one of a set of correction carrier offsets to said mixer until said timing recovery loop converges.

4. The digital receiver system of claim 3, wherein said set of correction carrier offsets are introduced into a carrier loop filter coupled in between said DDFS and said carrier phase detector.

5. A digital receiver system for providing coarse carrier offset acquisition, comprising:
   a mixer configured to receive an input signal having a carrier offset;
   a carrier recovery loop coupled to an input of said mixer; and
   a timing recovery loop, coupled to an output of said mixer, including:
      a timing phase detector, coupled to said output of said mixer, configured to generate a signal proportional to a difference between a current estimate of a timing offset and a true timing offset,
   wherein said carrier recovery loop is configured to introduce one of a set of correction carrier offsets to said mixer until said timing recovery loop converges.

6. The digital receiver system of claim 5, further comprising:
   a clock generator, coupled to an output of a timing loop filter, configured to generate a clock used by a rate converter to sample said input signal, wherein a frequency of said clock is based upon an output of said timing phase detector.

7. The digital receiver system of claim 1, further comprising:
   a front end filter coupled to said output of said mixer;
   a rate converter coupled to an output of said front end filter;
   a matched filter having a bandwidth coupled to an output of said rate converter, wherein said convergence of said timing recovery loop is related to said bandwidth of said match filter.

8. A digital receiver system for providing coarse carrier offset acquisition, comprising:
   a mixer configured to receive an input signal having a carrier offset;
   a carrier recovery loop coupled to an input of said mixer; and
   a timing recovery loop coupled to an output of said mixer,
   wherein said carrier recovery loop is configured to introduce one of a set of correction carrier offsets to said mixer until said timing recovery loop converges, said set of correction carrier offsets being a set of known correction offsets evenly spaced apart, said spacing being related to said convergence of said timing recovery loop.

9. A digital receiver system of claim 8, wherein said set of correction carrier offsets include correction carrier offsets of 3 MHz, 0 Hz, and −3 MHz.

10. A method for coarse carrier offset acquisition, comprising:
    (a) selecting one or more correction carrier offsets;
    (b) translating a digital signal having a carrier offset using said one or more correction carrier offsets to produce a frequency translated digital signal;
    (c) introducing a known timing error into a timing recovery loop to determine a state of said timing recovery loop; and
    (d) repeating steps (a) through (c) until said timing recovery loop converges.

11. The method of claim 10, further comprising:
    (e) determining a difference between an estimate of said carrier offset and a true value of said carrier offset; and
    (f) generating a signal to correct for said carrier offset in said digital signal, said signal being related to said difference.

12. The method of claim 10, further comprising:
    (e) coupling said one or more correction carrier offsets into a carrier loop filter.

13. The method of claim 10, further comprising:
    (e) predetermining values for said one or more correction carrier offsets by spacing said values for said one or more correction carrier offsets a distance apart, wherein said distance is related to said convergence of said timing recovery loop.

14. The method of claim 10, further comprising:
    (e) generating an error signal proportional to the difference between a current estimate of a timing offset and a true timing offset; and (f) generating a clock to sample said digital signal based upon said error signal.

15. The method of claim 10, further comprising:
(e) determining whether said carrier offset is a large carrier offset or a small carrier offset, wherein said timing recovery loop converges to said frequency translated digital signal having said small carrier offset, and said timing recovery loop does not converge to said frequency translated signal having said large carrier offset.

16. The method of claim 15, further comprising:
(f) acquiring timing necessary for symbol synchronization when said carrier offset is said small carrier offset; and
(g) applying said one or more correction carrier offsets when said carrier offset is said large carrier offset.

17. The method of claim 10, wherein said convergence of said timing loop further comprises:
determining a difference between a current estimate of a timing offset and a true timing offset.

18. The method of claim 10, wherein step (c) comprises:
(c)(i) monitoring said state of said timing recovery loop before introduction of said known timing error into said timing recovery loop;
(c)(ii) introducing said known timing error into said timing recovery loop;
(c)(iii) monitoring said state of said timing recovery loop after said introducing of said known timing error; and
(c)(iv) comparing said state of said timing recovery loop before said introducing of said known timing error and said state of said timing recovery loop after said introducing of said known timing error to determine said convergence of said timing recovery loop.

19. The method of claim 18, wherein said known timing error is introduced into a timing loop filter.

* * * * *